(12) United States Patent
Rathburn

(10) Patent No.: US 8,803,539 B2
(45) Date of Patent: Aug. 12, 2014

(54) COMPLIANT WAFER LEVEL PROBE ASSEMBLY

(75) Inventor: James Rathburn, Mound, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 451 days.

(21) Appl. No.: 13/266,522

(22) PCT Filed: May 25, 2010

(86) PCT No.: PCT/US2010/036047
§ 371 (c)(1),
(2), (4) Date: Oct. 27, 2011

(87) PCT Pub. No.: WO2010/141264
PCT Pub. Date: Dec. 9, 2010

(65) Prior Publication Data
US 2012/0068727 A1 Mar. 22, 2012

Related U.S. Application Data

(60) Provisional application No. 61/183,856, filed on Jun. 3, 2009.

(51) Int. Cl.
*G01R 1/067* (2006.01)
(52) U.S. Cl.
USPC .................................................... 324/755.01
(58) Field of Classification Search
USPC .............. 324/762.01–762.1, 754.01–754.3, 324/755.01–755.11
See application file for complete search history.

(56) References Cited

U.S. PATENT DOCUMENTS

| 3,672,986 A | 6/1972 | Schneble, Jr. et al. |
| 4,188,438 A | 2/1980 | Burns |

(Continued)

FOREIGN PATENT DOCUMENTS

| JP | 2003/217774 | 7/2003 |
| WO | WO 91/14015 | 9/1991 |

(Continued)

OTHER PUBLICATIONS

Office Action mailed Feb. 21, 2014 in co-pending U.S. Appl. No. 13/266,573, now published as US Patent Application Publication No. 2012/0061846.

(Continued)

*Primary Examiner* — Tung X Nguyen
(74) *Attorney, Agent, or Firm* — Stoel Rives LLP

(57) ABSTRACT

A probe assembly that acts as a temporary interconnect between terminals on a circuit member and a test station. The probe assembly can include a base layer of a dielectric material printed onto a surface of a fixture. The surface of the fixture can have a plurality of cavities. A plurality of discrete contact members can be formed in the plurality of cavities in the fixture and coupled to the base layer. A plurality of conductive traces can be printed onto an exposed surface of the base layer and electrically coupled with proximal ends of one or more of the discrete contact members. A compliant layer can be deposited over the conductive traces and the proximal ends of the contact members. A protective layer can be deposited on the compliant layer such that when the probe assembly is removed from the fixture the distal ends of the contact members contact terminals on the circuit member and the conductive traces electrically couple the circuit member to a test station. Electrical devices on the probe assembly can communicate with the test station to provide adaptive testing.

29 Claims, 13 Drawing Sheets

(56) References Cited

U.S. PATENT DOCUMENTS

| | | |
|---|---|---|
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,072,520 A | 12/1991 | Nelson |
| 5,127,837 A | 7/1992 | Shah et al. |
| 5,161,983 A | 11/1992 | Ohno |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh |
| 5,674,595 A | 10/1997 | Busacco et al. |
| 5,716,663 A | 2/1998 | Capote et al. |
| 5,741,624 A | 4/1998 | Jeng et al. |
| 5,761,801 A | 6/1998 | Gebhardt et al. |
| 5,791,911 A | 8/1998 | Fasano et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,925,931 A | 7/1999 | Yamamoto |
| 5,933,558 A | 8/1999 | Sauvageau et al. |
| 6,020,597 A | 2/2000 | Kwak |
| 6,062,879 A | 5/2000 | Beaman et al. |
| 6,080,932 A | 6/2000 | Smith et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,459,418 B1 | 10/2002 | Comiskey |
| 6,461,183 B1 | 10/2002 | Ohkita |
| 6,462,418 B2 | 10/2002 | Sakamoto et al. |
| 6,477,286 B1 | 11/2002 | Ouchi |
| 6,506,438 B2 | 1/2003 | Duthaler et al. |
| 6,521,489 B2 | 2/2003 | Duthaler |
| 6,545,291 B1 | 4/2003 | Amundson |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,744,126 B1 | 6/2004 | Chiang |
| 6,750,473 B2 | 6/2004 | Amundson |
| 6,750,551 B1 | 6/2004 | Frutschy et al. |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,244,967 B2 | 7/2007 | Hundt et al. |
| 7,249,954 B2 | 7/2007 | Weiss |
| 7,301,105 B2 | 11/2007 | Vasoya |
| 7,321,168 B2 | 1/2008 | Su Tao |
| 7,326,064 B2 | 2/2008 | Rathburn |
| 7,327,006 B2 | 2/2008 | Svard et al. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,422,439 B2 | 9/2008 | Rathburn et al. |
| 7,423,219 B2 | 9/2008 | Kawaguchi et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,508,076 B2 | 3/2009 | Japp et al. |
| 7,527,502 B2 | 5/2009 | Li |
| 7,537,461 B2 | 5/2009 | Rathburn |
| 7,538,415 B2 | 5/2009 | Lin et al. |
| 7,548,430 B1 | 6/2009 | Huemoeller et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,632,106 B2 | 12/2009 | Nakamura |
| 7,651,382 B2 | 1/2010 | Yasumura et al. |
| 7,658,163 B2 | 2/2010 | Renn |
| 7,674,671 B2 | 3/2010 | Renn |
| 7,726,984 B2 | 6/2010 | Bumb et al. |
| 7,748,110 B2 | 7/2010 | Asahi et al. |
| 7,800,916 B2 | 9/2010 | Blackwell et al. |
| 7,833,832 B2 | 11/2010 | Wood et al. |
| 7,897,503 B2 | 3/2011 | Foster et al. |
| 7,898,087 B2 | 3/2011 | Chainer |
| 8,072,058 B2 | 12/2011 | Kim et al. |
| 8,120,173 B2 | 2/2012 | Forman et al. |

(56) References Cited

U.S. PATENT DOCUMENTS

| | | |
|---|---|---|
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,232,632 B2 | 7/2012 | Rathburn |
| 8,278,141 B2 | 10/2012 | Chow et al. |
| 8,299,494 B2 * | 10/2012 | Yilmaz et al. .............. 257/139 |
| 8,344,516 B2 | 1/2013 | Chainer |
| 8,373,428 B2 | 2/2013 | Eldridge et al. |
| 8,421,151 B2 * | 4/2013 | Yamashita .............. 257/335 |
| 8,525,346 B2 | 9/2013 | Rathburn |
| 8,610,265 B2 | 12/2013 | Rathburn |
| 8,618,649 B2 | 12/2013 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0188890 A1 | 10/2003 | Bhatt et al. |
| 2003/0189083 A1 | 10/2003 | Olsen |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Yu-Nug Shen |
| 2004/0243348 A1 | 12/2004 | Minatani |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0164527 A1 | 7/2005 | Radza et al. |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0087064 A1 | 4/2006 | Daniel et al. |
| 2006/0157103 A1 | 7/2006 | Sheats et al. |
| 2006/0160379 A1 | 7/2006 | Rathburn |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2007/0021002 A1 | 1/2007 | Laurx et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0269999 A1 | 11/2007 | Di Stefano |
| 2007/0273394 A1 | 11/2007 | Tanner et al. |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0143358 A1 | 6/2008 | Breinlinger |
| 2008/0143367 A1 | 6/2008 | Chavineau-Lovgren |
| 2008/0156856 A1 | 7/2008 | Barausky et al. |
| 2008/0157361 A1 | 7/2008 | Wood et al. |
| 2008/0182436 A1 | 7/2008 | Rathburn |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0058444 A1 | 3/2009 | McIntyre |
| 2009/0061089 A1 | 3/2009 | King |
| 2009/0065918 A1 | 3/2009 | Murphy |
| 2009/0127698 A1 | 5/2009 | Rathburn |
| 2009/0133906 A1 | 5/2009 | Baek |
| 2009/0224404 A1 | 9/2009 | Wood et al. |
| 2009/0241332 A1 | 10/2009 | Lauffer et al. |
| 2009/0246136 A1 | 10/2009 | Beer et al. |
| 2009/0321915 A1 | 12/2009 | Hu et al. |
| 2010/0022105 A1 | 1/2010 | Di Stefano |
| 2010/0133680 A1 | 6/2010 | Kang et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |

(56) References Cited

FOREIGN PATENT DOCUMENTS

| WO | WO 2010/141316 | 12/2010 |
|---|---|---|
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |

OTHER PUBLICATIONS

Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.

Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Co-pending U.S. Appl. No. 13/575,368, titled High Speed Backplane Connector, filed Jul. 26, 2012.
Notification of Transmittal of the International Search Report and the Written Opinion of the International Searching Authority mailed Feb. 8, 2012 in International Application No. PCT/US2011/0.
Notification of Transmittal of the International Search Report and the Written Opinion of the International Searching Authority mailed Mar. 26, 2012 in International Application No. PCT/US2011/062313.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-To-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.

(56) References Cited

OTHER PUBLICATIONS

Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/266,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Co-pending U.S. Appl. No. 13/969,953 titled Compliant Conductive Nano-Particle Electrical Interconnect, filed Aug. 19, 2013.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amedment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.

(56) References Cited

OTHER PUBLICATIONS

Co-pending U.S. Appl. No. 14/086,029 titled Compliant Printed Circuit Semiconductor Package, filed Nov. 21, 2013.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Revision Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Notification of Transmittal of the International Search Report and the Written Opinion of the International Searching Authority mailed Apr. 5, 2012 in International Application No. PCT/US2011/062321.
Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013, in co-pending U.S. Appl. No. 13/448,914, now published as US Patent Application Publication No. US 2012/0202364.
Notification of Transmittal of the International Search Report and the Written Opinion of the International Searching Authority issued Jul. 30, 2010 in International Application No. PCT/US2010/036043.
Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.

(56) References Cited

OTHER PUBLICATIONS

Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Authority issued Sep. 27, 2011 in International Application No. PCT/US2011/038845.
Co-pending U.S. Appl. No. 13/266,486, titled High Performance Surface Mount Electrical Interconnect, filed Oct. 27, 2011.
Co-pending U.S. Appl. No. 13/266,573, titled Complant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Compliant Printed Circuit Semiconductor Tester Interface, filed Nov. 7, 2011.
Co-pending U.S. Appl. No. 13/319,228, titled Singulated Semiconductor Device Separable Electrical Interconnect, filed Nov. 7, 2011.

\* cited by examiner

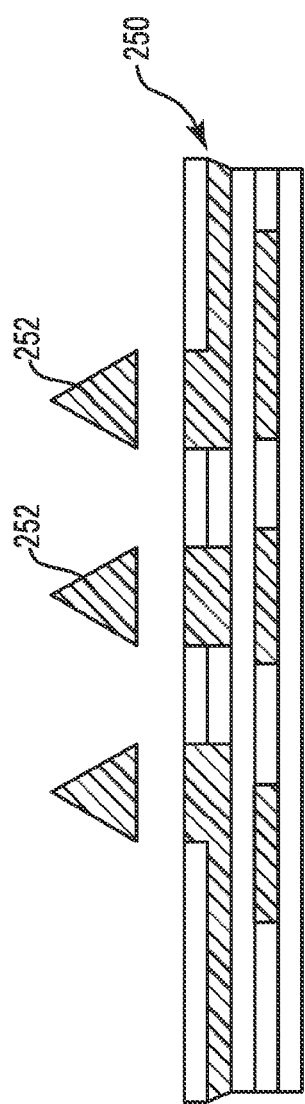

COMPLIANT WAFER LEVEL PROBE ASSEMBLY

CROSS-REFERENCE TO RELATED APPLICATIONS

This application is a national stage application under 35 U.S.C. §371 of International Application No. PCT/US2010/036047, titled COMPLIANT WAFER LEVEL PROBE ASSEMBLY, filed May 25, 2010, which claims priority to United States Provisional Application No. 61/183,856, filed Jun. 3, 2009, both of which are hereby incorporated by reference in their entireties.

TECHNICAL FIELD

The present disclosure relates to a probe assembly for testing electrical devices, and in particular, to a probe assembly that forms a temporary electrical interconnect between a wafer-level electrical device and a test station.

BACKGROUND OF THE INVENTION

During the semiconductor production process, manufacturers typically test integrated circuit (IC) devices while they are still grouped together as built on a silicon wafer. These tests verify various manufacturing parameters as well as chip function when possible. The connection points or terminals that will eventually be connected to the semiconductor package are typically very small and tightly spaced to conserve space on the wafer and allow for more ICs in the given area. Since the terminals are so small and tightly spaced, specialized tool sets are used to connect the IC to test electronics of a test station.

In basic terms, a precision piece of equipment called a probe station includes a customized precision connection device called a probe card mounted in a manner that allows contact tips of the probe card to be located directly over the terminal pads of the IC device on the silicon wafer. This probe card typically includes contact tips that correspond to the terminals to be contacted and the circuitry on the probe card routes the connection to a test station, which can be a general or special purpose computer.

When the device is powered, the test station looks for specific results and software determines if the IC passes or fails the test. Some applications allow for multiple devices to be contacted and tested at one time, increasing throughput of the testing process. Traditional probe cards consist of a variety of methods to transition the very small and tightly spaced terminal connections on the wafer to more widely spaced connections of the interface to a test station.

One probe style is called a cantilever needle, which is essentially a long precise wire that is shaped and positioned such that the contact tip is located where the terminal on the wafer will be during use to test an electrical device. Groups of needles are assembled into the probe card assembly and each needle is adjusted such that the field of tips all contact the desired terminal positions. Needle probes are typically the least expensive, are well established in the industry, and are widely available.

For mechanical reasons, the needles are relatively long (inches) to provide the required spring properties. Long contact members, however, tend to reduce the electrical performance of the connection by creating a parasitic effect that impacts the signal as it travels through the contact. Resistance in the contacts impacts the self heating effects as current passes through power delivery contacts. Also, the small space between contacts can cause distortion known as cross talk as a nearby contact may influence its neighbor. In most cases, the tests that are run using needle probes are typically basic on-off tests due to the limited signal integrity.

Another probe style is called a buckling beam or vertical probe. Basically, a series of very fine wires can be precisely located within an assembly that locates and guides each wire such that it can be located directly above the IC terminal to be connected. Buckling beam probes have been used for many years and can be based upon IBM technology that is over 20 years old. These probes are usually more expensive, and are typically used for area array connections. Again, the length of the contact wire to allow the beam to buckle is relatively large, so the signal performance can be impacted.

Another probe style is based upon a small precisely formed wire called a micro spring that is created on a sophisticated substrate in such a way that the tip of the wire is in position to contact the desired terminal on the wafer. There are also probe types that are made with semiconductor style processes, creating very small mechanisms commonly referred to as micro-electro-mechanical systems ("MEMS") devices. Micro spring and MEMS-based probes are typically very expensive, and although better electrically than the longer probe styles, they may have electrical limitations.

Membrane probes are made using a photolithography process to create a very intricate flexible printed circuit member. The precisely shaped probe tips can be routed to the tester electronics through the circuit traces on the flexible printed circuit member. The probe tips are created with a proprietary process where the desired shape can be coined at the desired location into a sacrificial substrate. A series of plating, lithography, sputtering and etching steps are used to create the final circuit.

Membrane probes typically have the best signal performance, but can be expensive to build. For applications requiring higher frequency testing, membrane probes are currently the only choice available. The manufacturing process is very complicated, with many thin film, plating and lithography steps. The complexity of the process results in yield loss and the capital requirements are fairly large. The manufacturing process limits the physical height of the probe tips, such that they do not extend very far off the membrane. There is a potential for the membrane probe to collect debris and crush it into the wafer, thereby damaging ICS. Also, the contact tips must be extremely planar relative to the wafer since the probe tips typically have little or no compliance to compensate for non-planarity.

All of these probe types are rather expensive, costing thousands or even hundreds of thousands of dollars, depending on the type and number of contact points required. Wafer manufactures typically test each device at least once, so durability of the probe tips can be critical.

As processors and electrical systems evolve, increased terminal count, reductions in the terminal pitch (i.e., the distance between the terminals), and signal integrity have been drivers that impact probe tip requirements. As terminal count increases, a certain degree of compliance is required between the contacts on the IC and the probe tips to accommodate the topographic differences and maintain reliable electrical connections. Next generation systems will operate above 5 GHz and beyond and existing probe cards will not achieve acceptable price/performance levels without significant revision.

BRIEF SUMMARY OF THE INVENTION

The present disclosure relates to a high performance probe assembly for testing wafer-level integrated circuits. A present probe assembly, according to one embodiment, can form a temporary electrical interconnect between an electrical device and a test station.

The present probe assembly can provide a low cost alternative to other probe products, by utilizing an additive printing process and unique probe member fabrication process. The nature of the process can allow for very high frequency performance, as well as the addition of on-board electrical devices and circuitry planes that are not available with other probe products. The present probe assembly can be superior to membrane probe products in terms of mechanical performance, manufacturing complexity, electrical performance, and cost.

The production cost for a probe assembly in accordance with the present disclosure can be a fraction of the cost of producing exiting probe cards. The use of additive processes, such as for example, printed electrical features, reduces the capital cost and lead time for building the present probe assemblies. The additive processes can also increase yields over probe systems that rely on conventional lithography tools and masks.

Internal compliance of the entire assembly and of individual probe members can greatly increase performance of the present probe assemblies. The ability to build multi-layer structures over a relatively large area can permit terminal pitch on the IC devices to be reduced. The addition of circuitry planes and electrical devices in the present probe assembly can provide performance enhancements not available with current probe systems. The ability to add electrical devices, such as transistors and memory, to the present probe assembly can provide the opportunity to incorporate test intelligence, extending the use of legacy test equipment and improving test performance. The present probe assemblies can provide the opportunity to develop adaptive testing and to alter the circuit members during testing.

The present probe assembly can act as a temporary interconnect between terminals on a circuit member and a test station. The probe assembly can include a base layer of a dielectric material printed onto a surface of a fixture. The surface of the fixture can have a plurality of cavities. A plurality of discrete contact member can be formed in the plurality of cavities in the fixture and coupled to the base layer. A plurality of conductive traces can be printed onto an exposed surface of the base layer and electrically coupled with proximal ends of one or more of the discrete contact members. A compliant layer can be printed or otherwise deposited over the conductive traces and the proximal ends of the contact members. A protective layer can be printed or otherwise deposited on the compliant layer, such that when the probe assembly is removed from the fixture the distal ends of the contact members can contact terminals on a circuit member and the conductive traces electrically couple the circuit member to a test station.

The probe assembly can optionally include at least one additional circuitry plane. The additional circuitry plane can be one or more of a ground plane, a power plane, an electrical connection to other circuit members, a dielectric layer, or a flexible circuit.

The contact members can be made from a curable conductive material, sintered conductive particles, a platable material, or a variety of other techniques. A flexible circuit member can optionally be electrically coupled to the conductive traces and extend beyond a perimeter edge of the probe assembly to electrically couple with other devices, such as for example the test station.

A plurality of electrical devices can be positioned on the probe assembly and electrically coupled to one or more of the conductive traces. The electrical devices can be any of a power plane, a ground plane, a capacitor, a resistor, a filter, a signal or power altering and enhancing device, a capacitive coupling feature, a memory device, an embedded integrated circuit, and a RF antennae. The electrical devices can be printed on one or more of the layers. These electrical devices can be used to monitor the test protocol, including performance of the device being tested, and to signal the test station to alter the protocol in response to the performance of the device being tested.

The present disclosure is also directed to a testing system for electrical devices. The testing system can include the probe assembly, a circuit member with terminals compressively engaged with distal ends of the contact members, and a test station electrically coupled to the conductive traces of the probe assembly.

A circuit member of the present disclosure can be a printed circuit board (PCB), a flexible circuit, a bare die device, an integrated circuit (IC) device, a wafer containing a plurality of IC devices, organic or inorganic substrates, or a rigid circuit.

A plurality of electrical devices can be located on the probe assembly and electrically coupled to one or more of the conductive traces. The testing test station can optionally include a first test protocol, and at least a second test protocol triggered by one or more of the electrical devices located on the probe assembly. The second test protocol can signal the test station to modify the circuit member, such as for example modifying software located in the circuit member.

The present disclosure is also directed to a method of forming a probe assembly. A base layer of a dielectric material can be printed onto a surface of a fixture using a maskless printing technology, such as for example inkjet printing technology or aerosol printing technology. A conductive material can be deposited into a plurality of the cavities in the fixture. The conductive material is processed to form probe members with a shape generally complementary to the cavities in the fixture. A plurality of conductive traces can be printed onto an exposed surface of the base layer and thereby electrically couple a plurality of the conductive traces with proximal ends of one or more of the discrete contact members. A compliant layer can be deposited over the conductive traces and the proximal ends of the contact members. A protective layer can be deposited on the compliant layer. The probe assembly is removed from the fixture to expose distal ends of the probe members.

In one embodiment, pre-formed conductive trace materials can be positioned in recesses or trenches. The recesses can be plated to form conductive traces with substantially rectangular cross-sectional shapes.

In another embodiment, a conductive foil is pressed into at least a portion of the recesses. The conductive foil is sheared along edges of the recesses. The excess conductive foil not located in the recesses is removed and the recesses are plated to form conductive traces with substantially rectangular cross-sectional shape.

The use of additive printing processes can permit the material set in a given layer of a probe assembly to vary. Traditional PCB and circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

The present disclosure is also directed to a method of adaptive testing of circuit members using the probe assembly of the present invention. Electrical devices on the probe assembly can monitor performance of the circuit member being tested and signal the test station to modify the test protocol accordingly. The test station can also be signaled to modify the circuit member.

BRIEF DESCRIPTION OF THE SEVERAL VIEWS OF THE DRAWING

FIG. 13 illustrates a method of reworking a probe assembly in accordance with an embodiment of the present disclosure.

DETAILED DESCRIPTION OF THE INVENTION

The present disclosure relates to a high performance probe assembly for testing wafer-level integrated circuits. The present probe assembly can be used with electrical devices having contact-to-contact spacing (pitch) on the order of less than about 1.0 millimeter ($1 \times 10^{-3}$ meters), and more preferably a pitch of less than about 0.7 millimeter, and most preferably a pitch of less than about 0.4 millimeter. Such fine pitch probe assemblies are especially useful for probing wafer-level integrated circuits.

Figure 1:
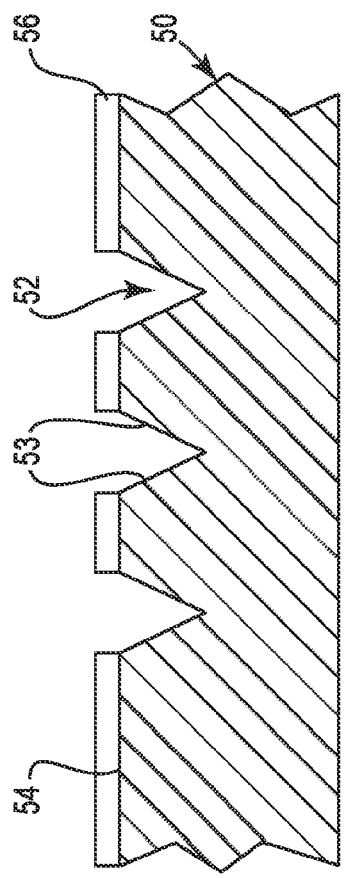
FIG. 1 is a cross-sectional view of a fixture for making a probe assembly in accordance with an embodiment of the present disclosure.

FIG. 1 is a cross-sectional view of a fixture 50 useful in making a probe assembly, in accordance with an embodiment of the present disclosure. The fixture 50 can include a plurality of cavities 52 in a first surface 54. The locations of the cavities 52 are arranged in an array that corresponds to terminals on a wafer-level IC device (see e.g., FIG. 6). The cavities 52 can be formed using a variety of techniques, such as molding, machining, printing, imprinting, embossing, etching, coining, and the like. Inner surfaces 53 of the cavities 52 can be pretreated preparatory to formation of a probe assembly.

A base layer 56 is preferably located on the first surface 54 of the fixture 50. In one embodiment, the base layer 56 is printed onto the first surface 54, while leaving the cavities 52 exposed. In another embodiment, the base layer 56 is applied to the first surface 54 before the cavities 52 are formed. The base layer 56 can facilitate removal of a probe assembly (such as the probe assembly 70 shown in FIG. 6) from the fixture 50. The base layer 56 is preferably a dielectric material that also acts as an electrical insulator and a carrier layer for the probe assembly 70.

The fixture 50 can be constructed from a variety of materials, such as for example metal, plastic, ceramics, and composites thereof. In one embodiment, the fixture 50 is made from a resist material that can be dissolved to release the probe assembly 70. Making the fixture 50 from a dissolvable material can permit the probe members (such as the probe members 60 shown in FIG. 6) to have a variety of internal features, undercuts, or cavities that are difficult or typically not possible to make using conventional molding or machining techniques, referred to herein as a "non-moldable features." The cavities 52 can be optionally coated with a material to facilitate release of the probe members 60 from the fixture 50.

Figure 2:
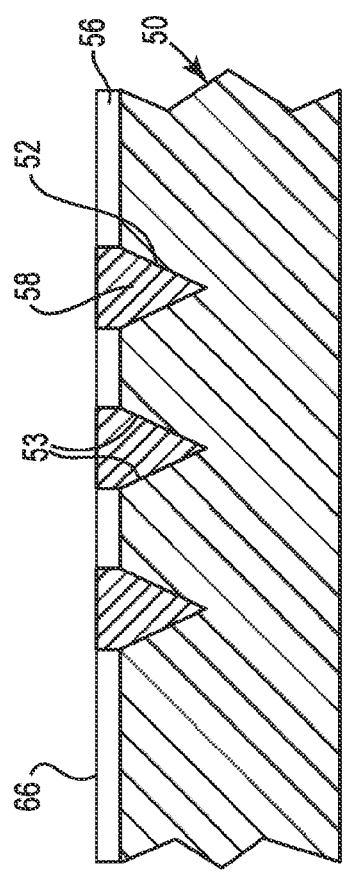
FIG. 2 illustrates probe members formed in the fixture of FIG. 1.

As illustrated in FIG. 2, conductive material 58 is deposited in the cavities 52. The conductive material 58 may be deposited up to a top surface 66 of the base layer 56. In one embodiment, the conductive material 58 may be a metallic powder that can be sintered to create probe members 60 (see FIG. 6). In another embodiment, the conductive material 58 is a flowable, curable conductive material. Various methods for maskless deposition of electronic materials, such as inkjet printing technology as will be described below, may also be used to deposit the conductive material 58 in the cavities 52.

Various methods for maskless deposition of electronic materials and forming electrical devices and features may also be used, such as disclosed in U.S. Pat. No. 7,485,345 (Renn et al.); U.S. Pat. No. 6,825,829 (Albert at al.); and U.S. Pat. Publication No. 2008/0008822 (Kowalski et al.), which are hereby incorporated by reference. Inkjet printing technology, aerosol printing technology, and other printing technology are examples of maskless deposition which can be used to deposit features.

The availability of printable silicon inks provides the ability to print the conductive material 58 and other electrically active materials to form electrical devices and features. Exemplary embodiments of printable silicone inks are disclosed, for example, in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. For example, conductive material can be deposited in the cavities using printing technology.

Printing processes can preferably be used to fabricate various functional structures, such as conductive paths and electrical devices without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process can be followed by a thermal treatment, such as in a furnace or with a laser, to achieve dense functionalized structures.

U.S. Pat. No. 6,506,438 (Duthaler et al.) and U.S. Pat. No. 6,750,473 (Amundson et al.), which are incorporated herein by reference, teach using inkjet printing to make various electrical devices, such as resistors, capacitors, diodes, inductors (or elements which can be used in radio applications or magnetic or electric field transmission of power or data), semiconductor logic elements, electro-optical elements, transistors (including, light emitting, light sensing or solar cell elements, field effect transistors, top gate structures), and the like.

U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference, teach using aerosol printing to create various electrical devices and features.

Printing of electronically active inks can be done on a large class of substrates, without the requirements of standard vacuum processing or etching. The inks may incorporate mechanical, electrical or other properties, such as, conducting, insulating, resistive, magnetic, semiconductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from Dupont located in Wilminton, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181 (Bridenbaugh et al.), which is incorporated herein by reference.

A protective layer can optionally be printed onto the electrical devices and features. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present invention.

An inkjet print head, or other print head, preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electropneumatic, electrostatic, rapid ink heating, magnetohydrodynamic, or any other technique well known to those skilled in the art. The deposited ink patterns typically undergo a curing step or another processing step before subsequent layers are applied.

While inkjet printing is preferred, the term "printing" is intended to include all forms of printing and coating, including: premetered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; aerosol printing processes; and other similar techniques.

As mentioned above, in one embodiment, the inner surfaces 53 of the cavities 52 can be optionally pretreated before deposition of the conductive material 58. For example, the inner surfaces 53 can be coated with particles of rhodium and then sintered. The sintered rhodium is then coated with nickel or copper. In another embodiment, the inner surfaces 53 can be coated with a low friction material that facilitates removal of the probe members 60 (see FIG. 6) from the fixture 50.

The conductive material 58 is preferably deposited in a first state and then processed to create a second more permanent state. For example, a metallic powder can be deposited in the cavities and subsequently sintered, or a curable conductive material may flow into the cavities 52 and can be subsequently cured. As used herein "cure" and inflections thereof refers to a chemical-physical transformation that allows a material to progress from a first form (e.g., flowable form) to a more permanent second form. The term "curable" refers to a characteristic of a material having the potential to be cured, such as for example by the application of a suitable energy source.

Figure 3:
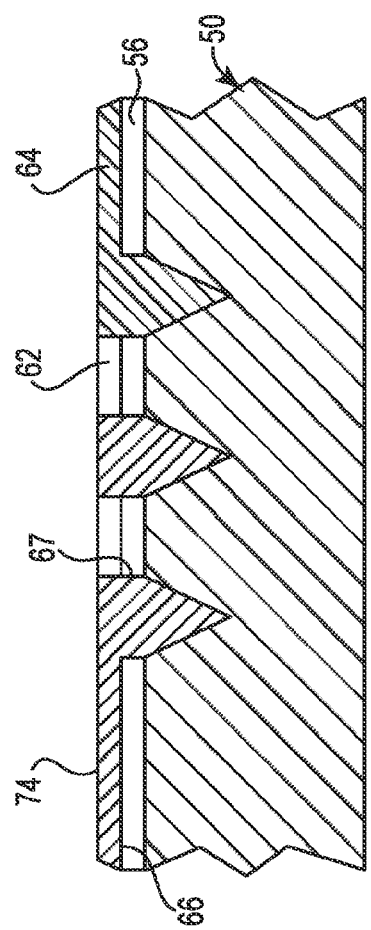
FIG. 3 illustrates conductive traces coupled to the probe members of FIG. 2.
Figure 9:
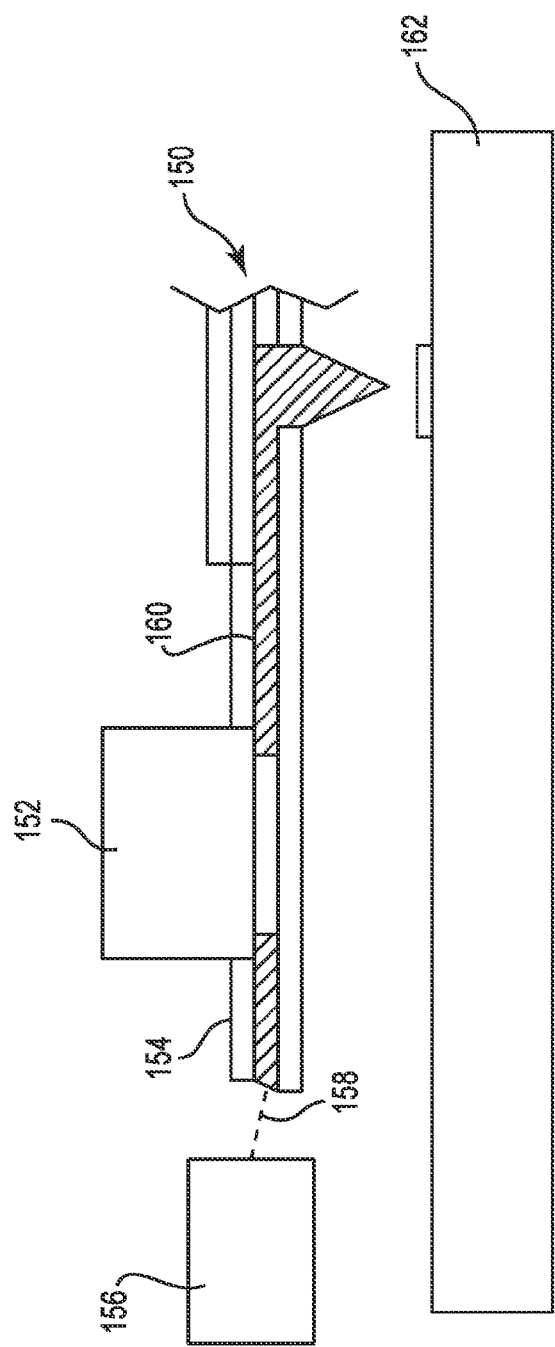
FIG. 9 is a cross-sectional view of a probe assembly with electrical devices in accordance with an embodiment of the present disclosure.
Figure 10:
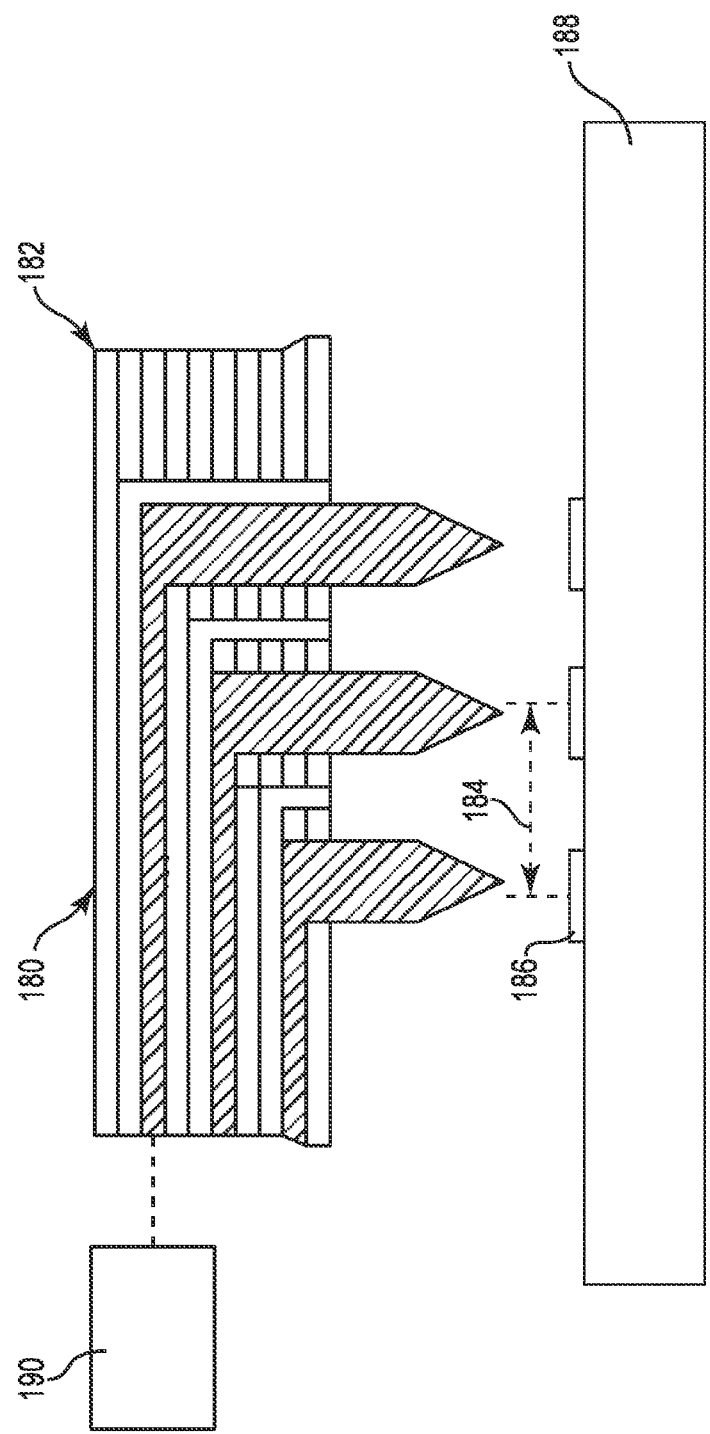
FIG. 10 is a cross-sectional view of a multi-layered probe assembly in accordance with an embodiment of the present disclosure.

FIG. 3 illustrates dielectric layers 62 and conductive traces 64 deposited, such as by printing, on an exposed top surface 66 of base layer 56 to create a routing to a test station (see e.g., FIGS. 9 and 10). In one embodiment, the conductive traces 64 can be created by sintering or printing a platable target that is subsequently plated with a conductive material. In one embodiment, the plating is optionally applied using printing technology, such as for example inkjet printing technology, aerosol printing technology, or other maskless deposition process. The printing process is additive in nature. Digital images of the dielectric layers 62 and conductive traces 64 are printed directly on the surface 66, eliminating or reducing many of the lithography, plating, and etching steps used to manufacture conventional probes. The resulting probe assembly 70 (see FIG. 6) provides high frequency capability, and can reduce manufacturing production time and cost by orders of magnitude.

The use of additive printing processes can permit a wide variety of materials to be applied on a layer with a registration relative to the features of the previous layer. Selective addition of conductive, non-conductive, or semi-conductive materials at precise locations to create a desired effect can offer advantages in tuning impedance or adding electrical function on a given layer. Tuning performance on a layer by layer basis relative to the previous layer can greatly enhance electrical performance.

The resulting conductive traces 64 preferably have substantially rectangular cross-sectional shapes. The use of additive printing processes permits conductive material, non-conductive material, and semi-conductive material to be simultaneously located on a single layer.

In one embodiment, recesses 67 (or trenches) formed in the base layer 56 can permit control of the location, cross section, material content, and aspect ratio of the probe members 60 (shown in FIG. 6) and the conductive traces 64. Maintaining the conductive traces 64 with a cross-section of 1:1 or greater can provide greater signal integrity than traditional subtractive trace forming technologies. For example, traditional methods take a sheet of a given thickness and etch the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using recesses to control the aspect ratio of the conductive traces 64 can result in a more rectangular or square cross-section of the conductive traces, with a corresponding improvement in signal integrity.

In another embodiment, pre-patterned or pre-etched thin conductive foil circuit traces can be transferred to the recesses 67. For example, a pressure sensitive adhesive can be used to retain the copper foil circuit traces in the recesses 67. The trapezoidal cross-sections of the pre-formed conductive foil traces are then post-plated. The plating material fills the open spaces in the recesses 67, resulting in a substantially rectangular or square cross-sectional shape corresponding to the shape of the recesses 67.

In another embodiment, a thin conductive foil is pressed into the recesses 67, and the edges of the recesses 67 act to cut or shear the conductive foil. The process positions a portion of the conductive foil in the recesses 67, but leaves the negative pattern of the conductive foil not wanted outside and above the recesses 67 for easy removal. Again, the foil in the recesses 67 is preferably post plated to add material to increase the thickness of the conductive traces 64 and to fill any voids left between the conductive foil and the recesses 67.

Figure 4:
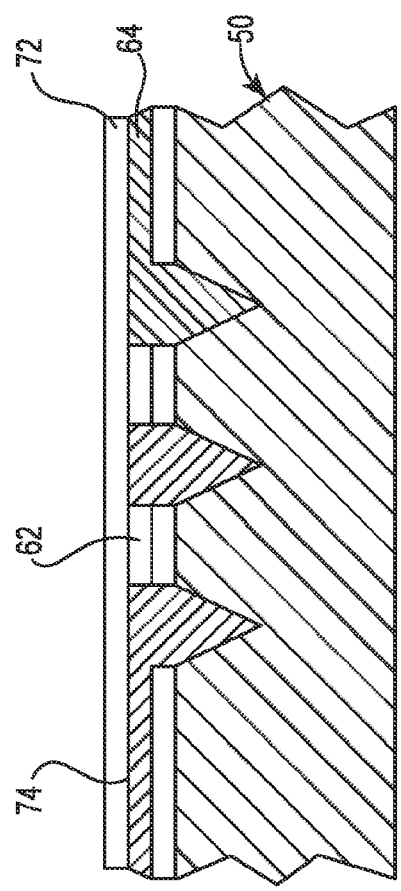
FIG. 4 illustrates a compliant layer added to the assembly of FIG. 3.

FIG. 4 illustrates a compliant layer 72 deposited on a surface 74 of the dielectric layers 62 and the conductive traces 64. The compliant layer 72 is preferably printed onto the surface 74. The compliant layer 72 can be printed using inkjet printing technology, aerosol printing technology, or other maskless deposition techniques as previously described. The compliant layer 72 provides normal force and actuation compliance. In another embodiment, the compliant layer 72 can be bonded to the surface 74. As used herein, "bond" or "bonding" refers to, for example, adhesive bonding, solvent bonding, ultrasonic welding, thermal bonding, or any other techniques suitable for attaching adjacent layers to a substrate.

Figure 5:
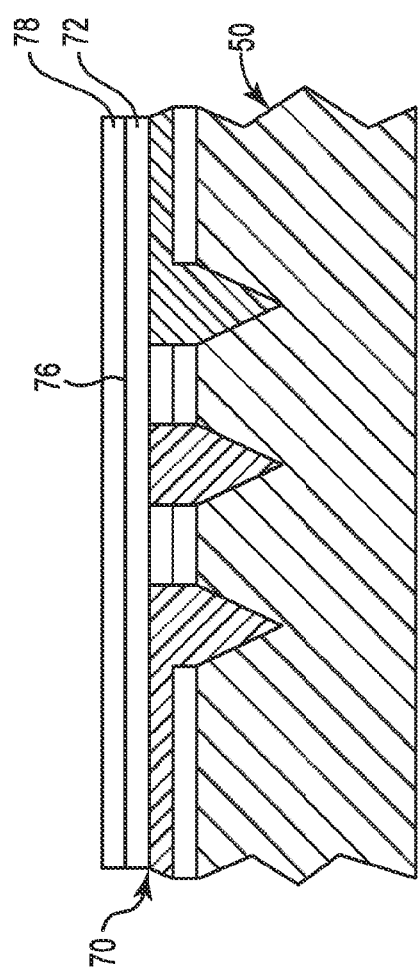
FIG. 5 illustrates a protective layer added to the assembly of FIG. 4.

Finally, FIG. 5 illustrates a protective layer 78 added to a top surface 76 of the compliant layer 72. The protective layer 78 can be applied using printing technology or can be a patterned film bonded to the top surface 76. The added protective layer 78 may complete a probe assembly 70.

Figure 6:
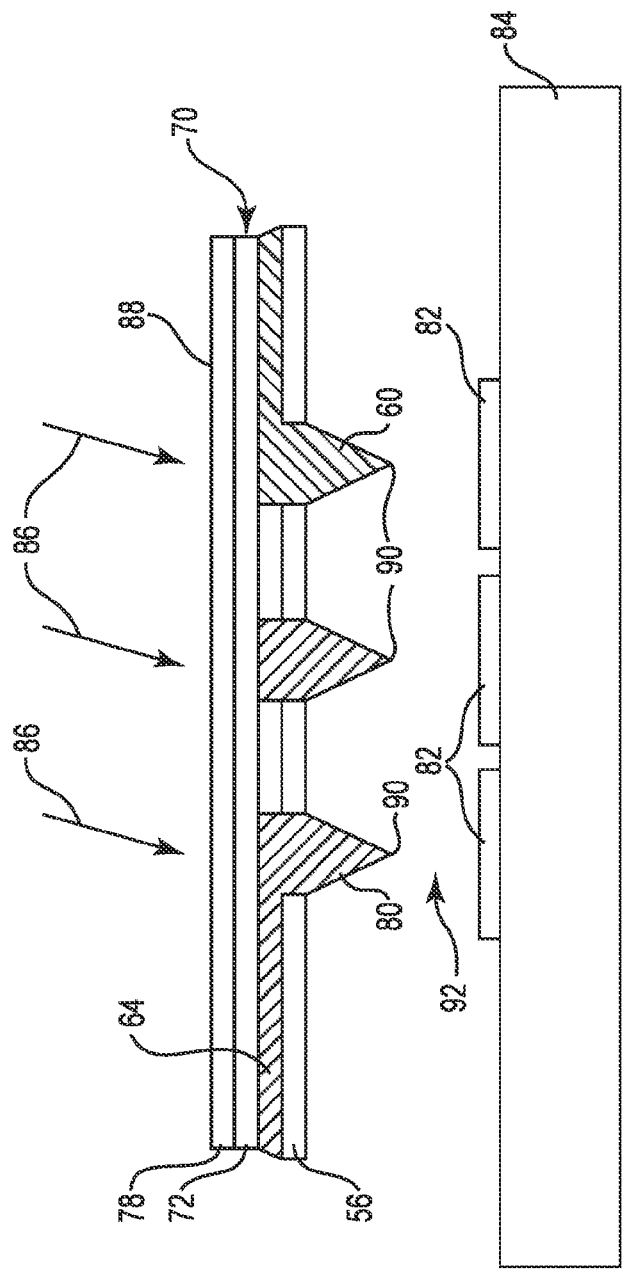
FIG. 6 is a cross-sectional view of a probe assembly in accordance with an embodiment of the present disclosure.

FIG. 6 illustrates the probe assembly 70 removed from the fixture 50 (shown in FIGS. 1-5). The base layer 56 is separated from the fixture 50. Exposed portions 80 of the probe members 60 are optionally plated. In another embodiment, the probe members 60 are further processed, such as for example by coining or etching, to facilitate engagement with terminals 82 on a circuit member 84. Although the present probe assembly 70 can be particularly well suited for probing wafer-level integrated circuits, it can be used on a variety of other circuit members, such as for example, packaged integrated circuits, unpackaged integrated circuits, printed circuit boards, flexible circuits, bare-die devices, organic or inorganic substrates, or any other device capable of carrying electrical current.

In operation, a normal force 86 can be applied to a top surface 88 of the probe assembly 70 (on the protective layer 78) so the distal ends 90 of the probe members 60 electrically couple with the terminals 82 on the circuit member 84. The compliant layer 72 can compensate for non-planarity at the interface 92.

Figure 7:
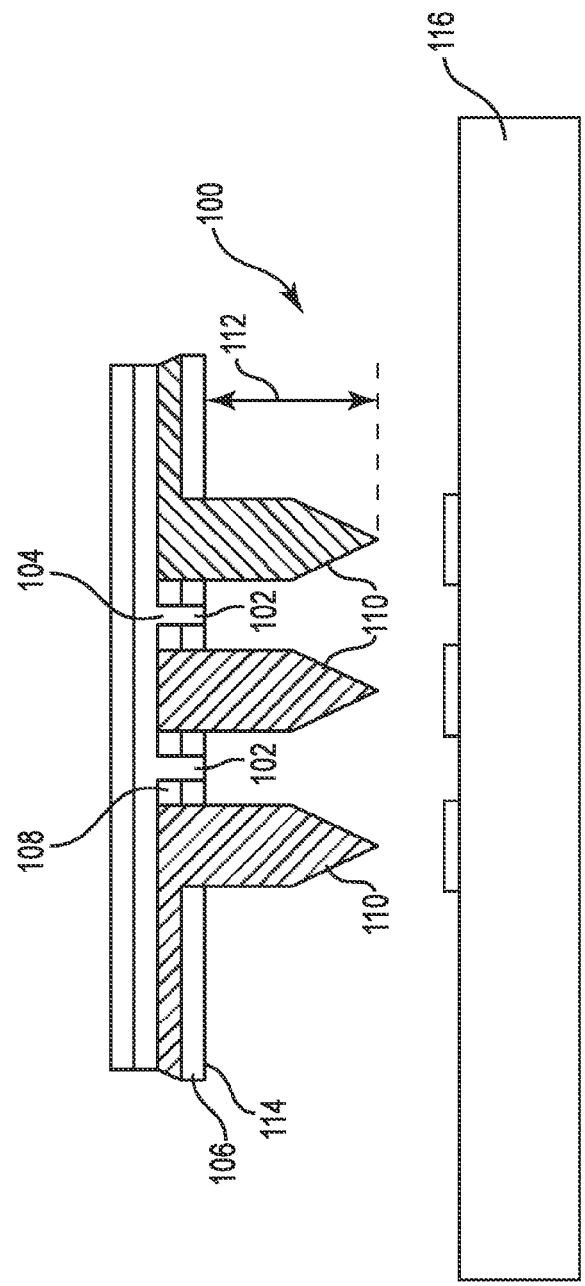
FIG. 7 is a cross-sectional view of an alternate probe assembly in accordance with an embodiment of the present disclosure.

FIG. 7 is a cross-sectional view of an alternate probe assembly 100 with gaps 102, 104 in dielectric layers 106, 108 in accordance with an embodiment of the present disclosure. In the illustrated embodiment, the gaps 102, 104 are located substantially adjacent to probe members 110 to provide a degree of compliance. The gaps 102, 104 decouple compliance of probe members 110 from the dielectric layers 106, 108.

A height 112 of the probe members 110 can be increased to reduce the chance of a bottom surface 114 of the dielectric layer 106 contacting a wafer 116. For example, the depth of the cavities 52 in the fixture 50 of FIG. 1 can be increased to create the longer probe members 110 of FIG. 7.

Figure 8:
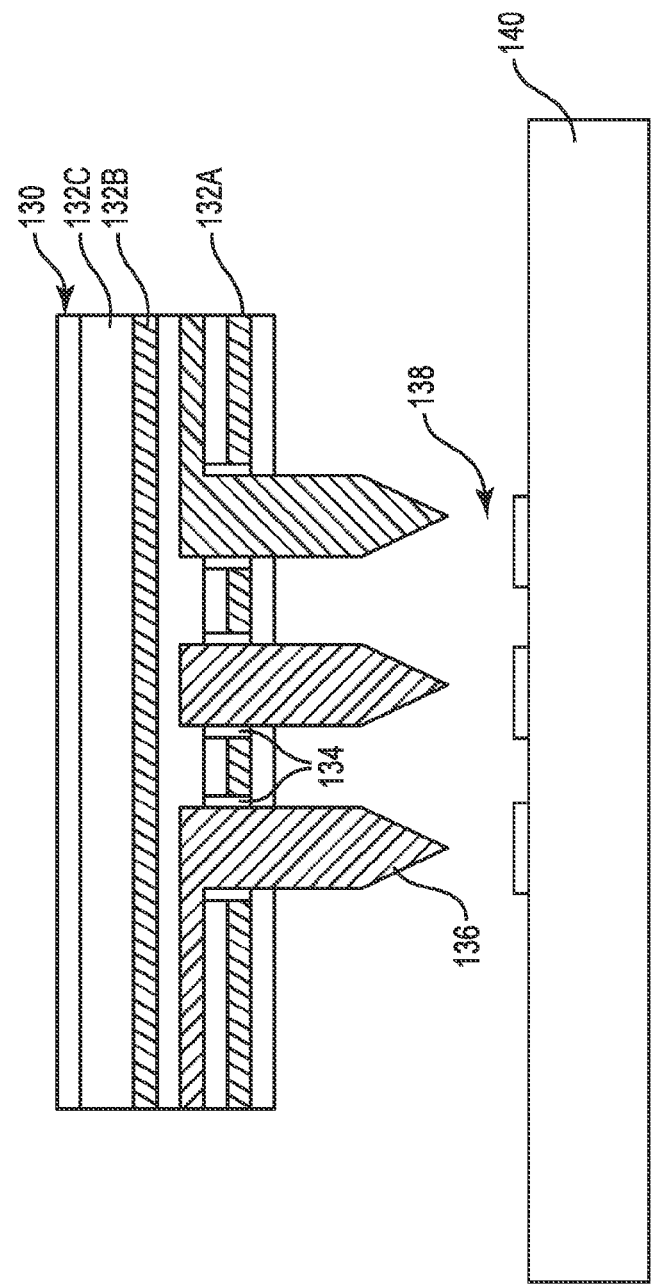
FIG. 8 is a cross-sectional view of a probe assembly with circuitry layers in accordance with an embodiment of the present disclosure.

FIG. 8 is a cross-sectional view of an alternate probe assembly 130 with additional functional layers 132A, 132B, 132C (collectively "132"), in accordance with an embodiment of the present disclosure. The functional layers can be, for example, specialty dielectrics, ground planes, power planes, shielding layers, stiffening layers, capacitive coupling features, circuitry layers, and the like. The layers 132 can be printed or preformed and selectively bonded or non-bonded to provide contiguous material or releasable layers.

In the illustrated embodiment, layers 132A and 132B are ground planes. Layer 132C is a compliant layer that operates in either alone or in conjunction with gaps 134 adjacent to the probe members 136 to compensate for non-planarity at the interface 138 with the wafer 140.

FIG. 9 is a cross-sectional view of a probe assembly 150 with additional electrical devices 152 in accordance with embodiments of the present disclosure. The electrical devices 152 can be capacitors, transistors, resistors, filters, signal or power altering and enhancing devices, memory devices, an embedded IC, an RF antennae, and the like. The electrical devices 152 can be located on surface 154 or embedded in one of the layers. The probe assembly 150 can include an extension 158, such as for example a flexible circuit member, electrically coupling conductive traces 160 to test station 156.

The electrical devices 152 can be added as discrete components or printed onto one of the layers. The electrical devices 152 can be printed using inkjet printing technology, aerosol printing technology, or other maskless deposition techniques, as previously described. Electrical devices that are typically located on the test station 156 can be incorporated into the probe assembly 150, improving electrical performance.

In one embodiment, the electrical devices 152 monitor the testing of the circuit member 162 and communicate feedback to the test station 156. In one embodiment, a feedback signal from the electronic devices 152 can cause the test station 156 to alter the testing protocol depending on the performance of the circuit member 162, referred to as adaptive testing. In one embodiment, the feedback signal from the electronic devices 152 can cause the test station 156 to alter the circuit member 162, such as for example, by altering software resident on the circuit member 162.

FIG. 10 is a cross-sectional view of a probe assembly 180 with multiple layers 182 in accordance with an embodiment of the present disclosure. The probe assembly 180 can permit IC manufactures to reduce the pitch 184 of the terminals 186 on the IC devices 188 since the required signal routing to a test station 190 is performed by the probe assembly 180.

Figure 11:
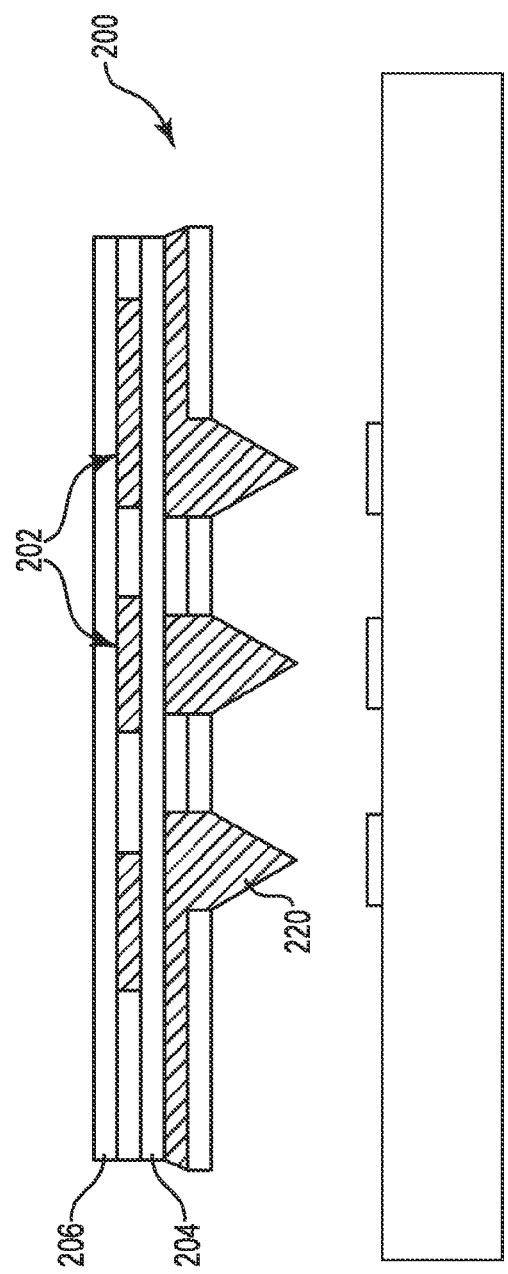
FIG. 11 is a cross-sectional view of a probe assembly with coupling features in accordance with an embodiment of the present disclosure.

FIG. 11 is a cross-sectional view of a probe assembly 200 with coupling features 202 in accordance with an embodiment of the present disclosure. In one embodiment, the coupling features 202 can be capacitive couplings located between dielectric layers 204, 206. In another embodiment, the coupling features 202 can be optical fibers supported by the dielectric layers 204, 206. Optical quality materials can optionally be printed directly onto the dielectric layers 204, 206. The printing process can also allow for deposition of coatings in-situ that will enhance the optical transmission or reduce loss. The precision of the printing process can resolve misalignment issues when the optical fibers 202 are placed into a connector. In another embodiment, the coupling features 202 can be embedded coaxial or printed micro strip RF circuits with dielectric layers 204, 206. The dielectric layers 204, 206 can be formed of metal. Any of the structures noted above, as well as the probe members 220, can be created by printing dielectrics and metallization geometry.

Figure 12:
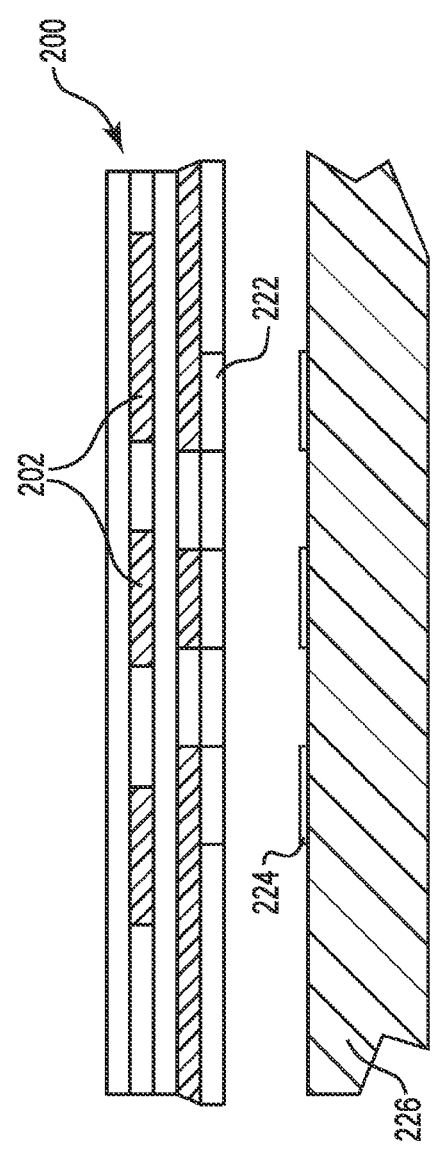
FIG. 12 is a cross-sectional view of the probe assembly of FIG. 11 with capacitive coupling features instead of probe members in accordance with an embodiment of the present disclosure.

FIG. 12 illustrates the probe assembly 200 of FIG. 11 with probe members 220 (shown in FIG. 11) removed. Optional different dielectric materials 222 can be located where the probe members 220 were located. The coupling features 202 can capacitively couple with terminals 224 on the wafer 226 due to the very precise planar nature of the printing process.

FIG. 13 illustrates a probe assembly 250 on which damaged probe members are removed and new probe members 252 are re-printed. Although the illustrated embodiment discloses triangular shaped probe members 252, a variety of other non-triangular shapes can be created using printing technology.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the present invention. The upper and lower limits of these smaller ranges which may independently be included in the smaller ranges is also encompassed within the embodiments of the invention, subject to any specifically excluded limit in the stated range. Where the stated range includes one or both of the limits, ranges excluding either both of those included limits are also included in the embodiments of the invention.

Unless defined otherwise, all technical and scientific terms used herein have the same meaning as commonly understood by one of ordinary skill in the art to which the embodiments of the invention belong. Although any methods and materials similar or equivalent to those described herein can also be used in the practice or testing of the embodiments of the present invention, the preferred methods and materials are now describe. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the embodiments of the present invention are not entitled to antedate such publication by virtue of prior invention. Further, the dates of publication provided may be different from the actual publication dates which may need to be independently confirmed.

Other embodiments of the invention are possible. Although the description above contains much specificity, these should not be construed as limiting the scope of the invention, but as merely providing illustrations of some of the presently preferred embodiments of this invention. It is also contemplated that various combinations or sub-combinations of the specific features and aspects of the embodiments may be made and still fall within the scope of the invention. It should be understood that various features and aspects of the disclosed embodiments can be combined with or substituted for one another in order to form varying modes of the disclosed embodiments of the present invention. Thus, it is intended that the scope of at least some of the present invention herein disclosed should not be limited by the particular disclosed embodiments described above.

Thus, the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

What is claimed is:

1. A probe assembly to act as a temporary interconnect between terminals on a circuit member and a test station, the probe assembly comprising:
   a base layer of a dielectric material printed onto a surface of a fixture, the surface of the fixture having a plurality of cavities;
   a plurality of discrete contact members formed in the plurality of cavities in the fixture and coupled to the base layer;
   a plurality of conductive traces printed onto an exposed surface of the base layer and electrically coupled with proximal ends of one or more of the discrete contact members;
   a compliant layer deposited over the conductive traces and the proximal ends of the contact members, the compliant layer adapted to bias the contact members toward the terminals on the circuit member and to compensate for non-planarity of the terminal; and
   a protective layer deposited on the compliant layer, wherein removal of the probe assembly from the fixture allows distal ends of the contact members to contact terminals on the circuit member such that the conductive traces electrically couple the circuit member to the test station.

2. The probe assembly of claim 1, wherein the conductive traces comprise substantially rectangular cross-sectional shapes.

3. The probe assembly of claim 1, wherein a conductive material, a non-conductive material, and a semi-conductive material are printed on a single layer of the probe assembly.

4. The probe assembly of claim 1, further comprising at least one additional circuitry plane comprising one of a ground plane, a power plane, an electrical connection to other circuit members, a dielectric layer, and a flexible circuit.

5. The probe assembly of claim 1, wherein the contact members are formed from one of a curable conductive material, sintered conductive particles, and a platable material.

6. The probe assembly of claim 1, further comprising a flexible circuit member electrically coupled to the conductive traces and extending beyond a perimeter edge of the probe assembly.

7. The probe assembly of claim 1, further comprising a plurality of electrical devices located on the probe assembly and electrically coupled to one or more of the conductive traces.

8. The probe assembly of claim 7, wherein the electrical devices are selected from the group consisting of a power plane, ground plane, capacitor, resistor, filters, signal or power altering and enhancing device, capacitive coupling feature, memory device, embedded integrated circuit, and RF antennae.

9. The probe assembly of claim 1, further comprising a plurality of electrical devices printed on one or more of the layers and electrically coupled to at least one contact member.

10. A testing system for electrical devices comprising:
    a probe assembly comprising;
       a base layer of a dielectric material printed onto a surface of a fixture, the surface of the fixture having a plurality of cavities;
       a plurality of discrete contact members formed in the plurality of cavities in the fixture and coupled to the base layer;
       a plurality of conductive traces printed onto an exposed surface of the base layer and electrically coupled with proximal ends of one or more of the discrete contact members;
       a compliant layer deposited over the conductive traces and the proximal ends of the contact members;
       a protective layer deposited on the compliant layer;
    a circuit member comprising terminals compressively engaged with distal ends of the contact members, the compliant layer biasing the contact members toward terminals on a circuit member and to compensate for non-planarity of the terminals; and
    a test station electrically coupled to the conductive traces of the probe assembly.

11. The probe assembly of claim 10, wherein the conductive traces comprise substantially rectangular cross-sectional shapes.

12. The probe assembly of claim 10, wherein a conductive material, a non-conductive material, and a semi-conductive material are printed on a single layer of the probe assembly.

13. The testing system of claim 10, wherein the circuit member is one of a printed circuit board, a flexible circuit, a bare die device, a wafer containing a plurality of integrated circuit devices, an integrated circuit device, organic or inorganic substrates, and a rigid circuit.

14. The testing system of claim 10, further comprising a plurality of electrical devices located on the probe assembly and electrically coupled to one or more of the conductive traces.

15. The testing system of claim 14, wherein the electrical devices are programmed to monitor performance of the circuit member during a testing protocol.

16. The testing system of claim 14, wherein the test station comprises:
    a first test protocol; and
    at least a second test protocol triggered by one or more of the electrical devices located on the probe assembly.

17. The testing system of claim 16, wherein the second test protocol signals the test station to modify the circuit member.

18. The testing system of claim 16, wherein the second test protocol modifies software located in the circuit member.

19. A method of forming a probe assembly comprising the steps of:
- printing a base layer of a dielectric material onto a surface of a fixture;
- depositing a conductive material into a plurality of the cavities in the fixture;
- processing the conductive material to form discrete contact members with a shape generally complementary to the cavities in the fixture;
- printing a plurality of conductive traces onto an exposed surface of the base layer and so as to electrically couple the plurality of conductive traces with proximal ends of one or more of the discrete contact members;
- depositing a compliant layer over the conductive traces and the proximal ends of the discrete contact members;
- depositing a protective layer onto an exposed surface of the compliant layer;
- removing the probe assembly from the fixture to expose distal ends of the probe members; and
- compressively engaging distal ends of the probe members with terminals on a circuit member, the compliant layer biasing the probe members toward terminals on the circuit member and compensating for non-planarity of the terminal.

20. The method of claim 19, wherein the conductive traces comprise substantially rectangular cross-sectional shapes.

21. The method of claim 19, further comprising printing a conductive material, a non-conductive material, and a semi-conductive material on a single layer of the probe assembly.

22. The method of claim 19, further comprising:
- positioning pre-formed conductive trace materials in recesses of in base layer; and
- plating the recesses of the base layer to form conductive traces with substantially rectangular cross-sectional shapes.

23. The method of claim 19, further comprising:
- pressing a conductive foil into at least a portion of recesses in the base layer;
- shearing the conductive foil along edges of the recesses;
- removing excess conductive foil not located in the recesses; and
- plating the recesses to form conductive traces with substantially rectangular cross-sectional shapes.

24. The method of claim 19, further comprising the steps of:
- engaging the distal ends of the probe members with terminals on a circuit member; and
- electrically coupling the conductive traces a circuit member to a test station.

25. The method of claim 19, further comprising the step of forming at least one additional circuitry plane in the probe assembly.

26. The method of claim 19, further comprising electrically coupling a flexible circuit member to the conductive traces and extending the flexible circuit member beyond a perimeter edge of the probe assembly.

27. The method of claim 19; further comprising the step of:
- positioning a plurality of electrical devices on the probe assembly; and
- electrically coupling the plurality of electrical devices to at least one contact member.

28. The method of claim 19, further comprising the steps of:
- printing a plurality of electrical devices on the probe assembly; and
- electrically coupling a plurality of the electrical devices to at least one contact member.

29. The method of claim 19, wherein the step of processing the conductive material comprises one of sintering, plating, or curing.

* * * * *